(12) United States Patent
Momoki

(10) Patent No.: US 6,764,271 B2
(45) Date of Patent: Jul. 20, 2004

(54) SUBSTRATE CONVEYER ROBOT

(75) Inventor: Itaru Momoki, Tokyo (JP)

(73) Assignee: Hirata Corporation (JP)

( * ) Notice: Subject to any disclaimer, the term of this patent is extended or adjusted under 35 U.S.C. 154(b) by 0 days.

(21) Appl. No.: 09/986,952

(22) Filed: Nov. 13, 2001

(65) Prior Publication Data

US 2002/0094265 A1 Jul. 18, 2002

(30) Foreign Application Priority Data

Nov. 30, 2000 (JP) ........................................ 2000-364348

(51) Int. Cl.[7] .............................................. B66C 23/00
(52) U.S. Cl. ...................... 414/744.5; 901/15; 901/21; 74/490.05
(58) Field of Search ....................... 414/744.5; 901/15, 901/21; 74/490.04, 490.05

(56) References Cited

U.S. PATENT DOCUMENTS

| | | | |
|---|---|---|---|
| 5,102,280 A | * | 4/1992 | Poduje ................ 414/744.5 X |
| 5,584,647 A | * | 12/1996 | Uehara et al. ........... 414/744.5 |
| 5,741,113 A | * | 4/1998 | Bacchi et al. ............ 414/744.5 |
| 5,765,444 A | * | 6/1998 | Bacchi et al. ............ 74/490.03 |

FOREIGN PATENT DOCUMENTS

| JP | 11-33948 | 2/1999 |
|---|---|---|
| JP | 2000-133690 | 5/2000 |

* cited by examiner

*Primary Examiner*—Donald W. Underwood
(74) *Attorney, Agent, or Firm*—Lorusso, Loud & Kelly

(57) ABSTRACT

A substrate conveyer robot inserts and removes a substrate to and from a an arbitrarily positioned container. A base is rotatably driven by a first motor which defines a pivotal center. A first spindle is rotated by a second motor independent of rotation of the base, is positioned coaxially with the pivotal center, and one end of a first arm is attached to the first spindle. A second spindle on the other end of the first arm is rotated by a gear ratio 2:1, and one end of a second arm is attached to the second spindle. A third spindle is carried on the other end of the second arm and is rotated by a gear ratio 1:2. One end of a third arm is attached to the third spindle, and a hand for holding a substrate is attached on the other end of the third arm.

2 Claims, 10 Drawing Sheets

US 6,764,271 B2

SUBSTRATE CONVEYER ROBOT

BACKGROUND OF THE INVENTION

1. Field of the Invention

The present invention relates to a robot for conveying a substrate, for example, a substrate conveyer robot suitable for use in conveying a semiconductor wafer substrate to place it in a container such as a cassette, and to take it out from the container.

2. Related Art

Conventionally, a wafer substrate conveyer robot of the belt link type has an arm expansion/contraction mechanism with first through third arms, in which the gear ratio of the pulley furnished on the rotation spindle of each arm is 2:1:2. This type of robot conveys the substrate horizontally by the control of only two axes. One of them is a robot advancing/retreating axis R for linearly advancing and retreating the third arm by the belt link mechanism, and the other one is a robot revolving axis θ for revolving the rotary base of the robot. Further, with lifting/lowering of all arms, the robot inserts and removes the substrate to and from the cassette.

In general, a substrate conveyer robot 01 possesses an arm expansion/contraction mechanism composed of three arms 05, 07, 09, and the two control axes, i.e., the robot revolving axis θ and the robot advancing/retreating axis R. As illustrated in FIG. 11, the center of the substrate 030 held by a hand 010 fixed on the third arm 09 advances and retreats along a straight line J0 that passes through the center of a rotary shaft (=a first spindle; this is positioned on the same axis as the robot revolving axis θ) of the first arm 05. Thus, the substrate conveyer robot 01 is designed to convey and insert the substrate 030 only into a cassette 032 that is disposed with its face centered on the line J0. Here, the straight line J0 coincides with the robot advancing/retreating axis R.

The cassette 032 is in the shape of a quadrangle, and permits the substrate 030 to be inserted only from one direction perpendicular to the plane of the opening thereof. In the case of the conventional robot with two axes, as illustrated in FIG. 11(a) through FIG. 11(c)), the robot 010 or cassette 032 has been required to be disposed in such a manner that the center line of the cassette 032 perpendicular to the aperture plane passes through the robot revolving axis θ (the pivotal center). A rotation base 03 is rotatable around the robot revolving axis θ, so that the third arm 09 can be positioned perpendicular to the front of the cassette 032. The third arm 09 is advanced and retreated linearly along the robot advancing/retreating axis R (the straight line J0), thereby inserting and taking out the substrate 030 to and from the cassette 032. In other words, the control of the rotating movement around the robot revolving axis θ and the control of the advancing and retracting movement along the robot advancing/retreating axis R have been carried out sequentially, not simultaneously.

As described above, most of the conventional robots possessing two control axes, the robot revolving axis θ and the robot advancing/retreating axis R, presumably, do not combine the control of rotation around the robot revolving axis θ with simultaneous control of the advancing and retracting along the robot advancing/retreating axis R. Therefore, the conventional robots could only insert and remove the substrate to and from the cassette that is positioned in a radial manner to (in other words, positioned right in front of) the robot revolving axis θ.

Therefore, in order for the robot to control the insertion and removal of the substrate to and from the cassette, even in case the cassette is positioned on an arbitrary straight line deviating from the robot revolving axis θ, there was no way to use such a robot other than that disclosed in Japanese Patent Laid-Open No. Hei 11(1999)-33948 Publication. This robot adds one axis to the foregoing two axes (two control axes) to freely control the position and direction of the hand of the last arm in the horizontal plane.

However, the use of the robot disclosed in the above publication requires an extra drive along the additional axis, and at the same time complicates control, thus increasing the cost.

The substrate conveyer robot illustrated in FIG. 11 is a single arm sequence type, having an arm expansion/contraction mechanism composed of three arms operative in a single sequence. However, a double arm sequence type substrate conveyer robot that has (a pair) bilaterally symmetrical arm expansion/contraction mechanisms operative in two sequences has the same problem as described above.

SUMMARY OF INVENTION

The present invention has been made with a view toward solving the above-described problems of the conventional substrate conveyer robots, and an object of the invention is to provide a substrate conveyer robot that can insert and remove a substrate to and from a container disposed in an arbitrary position and orientation, within an accessible range of the robot hand, with a minimum number of control axes, and at a low production cost.

To accomplish the foregoing object, according to one aspect of the invention, the substrate conveyer robot is provided with a rotatable base 3 rotatably driven by a first motor M1 inside the body of the robot, which has a rotational axis Q, on which a first spindle 4 is located in a state isolated from the rotation of the rotatable base 3, which is coaxial with the rotational axis Q, and is rotatably driven by a second motor M2. One end of a first arm 5 is attached to the first spindle 4 and a second spindle 6 protrudes from the other end of the first arm 5 independent of the rotation of the first arm 5, which is rotated with a gear ratio of 2:1 by way of pulleys and a timing belt inside the first arm 5. One end of a second arm 7 is attached to the second spindle 6 and a third spindle 8 protrudes from the other end of the second arm 7 and is independent of rotation of the second arm 7, which is rotated at a gear ratio of 1:2 by way of pulleys and a timing belt inside the second arm 7. The distance between the first spindle 4 and the second spindle 6 is equal to the distance between the second spindle 6 and the third spindle 8. One end of a third arm 9 is attached to the third spindle 8 and a hand 10 for holding a substrate is firmly attached on the other end of the third arm 9. With the angle of rotation of the rotation base 3 represented by θ and the angle of rotation of the first arm 5 is represented by φ, a control device is provided which controls the angles of rotation θ and φ in such a manner that the center point of the substrate held by the hand 10, horizontally spaced from the pivotal center Q, moves linearly relative to the body of the robot on the straight line H, in an arbitrary direction within an accessible range of the hand 10, and the substrate is inserted into and removed from a container, while the substrate is being rotated.

The substrate conveyer robot with the above construction is a so-called single arm sequence type substrate conveyer robot having a single sequence arm expansion/contraction mechanism that contains the first through third arms 5, 7, and 9. The control device controls the angle of rotation θ of the rotatable base 3 provided in the body of the robot and the angle of rotation φ of the first arm 5, in such a manner that the center point of the substrate held by the hand 10, spaced from the pivotal center Q, moves linearly relative to the body of the robot on the straight line H in an arbitrary direction within the accessible range of the hand 10, and the substrate is inserted into and removed from the container, while the substrate is being rotated. Therefore, in contrast to the conventional single arm sequence type substrate conveyer robot, the invention provides a substrate conveyer robot that can insert and remove the substrate to and from the container disposed in an arbitrary position and direction within the accessible range of the hand 10 of the robot, without increasing the number of control axes, at a low production cost.

Further, in the foregoing construction, the control device preferably controls the rotation angles θ and φ each so as to satisfy:

$$\{m+2L\sin(\phi)\}\sin(\theta)=h(\text{constant}),$$

where it is assumed that the center point of the substrate is spaced from the pivotal center Q by a constant distance h, and moves linearly relative to the body of the robot on the straight line H in an arbitrary direction within the accessible range of the hand 10, and that the distance between the first spindle 4 and the second spindle 6 and the distance between the second spindle 6 and the third spindle 8 are represented by L, and that the distance between the third spindle 8 and the center of the substrate is represented by m. As the result, the combination control of these angles of rotation θ and φ becomes very simple, with the center point of the substrate held by the hand 10, spaced from the pivotal center Q, moved linearly relative to the body of the robot on the straight line H in an arbitrary direction within the accessible range of the hand 10, and the substrate is inserted into and removed from the container, while being rotated.

According to another aspect of the invention, the substrate conveyer robot is provided with a rotatable base 3 rotatably driven by a first motor M1 inside the body of the robot, which has a pivotal center Q, in which first spindles 4, 4' are rotatable independent of rotation of the rotatable base 3 and are spaced an equal distance x, symmetrically, from the pivotal center Q. Spindles 4,4' are rotatably driven by second motors M2, M2', respectively. First ends of first arms 5, 5' are respectively attached to the first spindles 4, 4' and second spindles 6, 6' protrude from opposite ends of the first arms 5, 5' and are rotatably driven, independent of the rotation of the first arms 5, 5' with a gear ratio of 2:1 by way of pulleys and timing belts inside the first arms 5, 5'. First ends of second arms 7, 7' are attached to the second spindles 6, 6', respectively and third spindles 8, 8' are at the opposite ends of the second arms 7, 7'. Third spindles 8, 8' are rotatably driven, independent of the rotation of the second arms 7, 7', with a gear ratio 1:2 by way of pulleys and timing belts inside the second arms 7, 7'. The distance between the first spindles 4, 4' and the second spindles 6, 6' is equal to the distance between the second spindles 6, 6' and the third spindles 8, 8'. First ends of third arms 9, 9' are attached to the third spindles 8, 8' and hands 10, 10' for holding substrates are firmly attached on the opposite ends of the third arms 9, 9'. Centers of the substrates held by the hands 10, 10' are positioned offset radially inward by an equal distance x from the third spindles 8, 8', and the first spindles 4, 4' are symmetrically offset radially outward by the distance x from the pivotal center Q. With the angle of rotation of the rotatable base 3 represented by θ and the angles of rotation of the first arms are each represented by φ, φ', a control device is provided which controls the angles of rotation θ and φ, φ', in such a manner that center points of the substrates held by the hands 10, 10', spaced from the pivotal center Q, move linearly relative to the body of the robot along the straight lines H, H' in arbitrary directions and within accessible ranges of the hands 10, 10', and the substrates are inserted into and removed from a container or containers, while being rotated.

The substrate conveyer robot with the above construction is a so-called double arm sequence type substrate conveyer robot having two sequences, i.e., a pair of arm expansion/contraction mechanisms, which contain first through third arms 5, 5', 7, 7', and 9, 9' respectively, in a bilateral symmetry. The control device controls the angle of rotation θ of the rotatable base 3 provided in the body of the robot and the angles of rotation φ, φ' of the first arms 5, 5', so that the center points of the substrates held by the hands 10, 10', offset from the pivotal center Q, move linearly relative to the body of the robot along the straight lines H, H' in arbitrary directions, within the accessible ranges of the hands 10, 10', and the substrates are inserted into and removed from the container(s), while being rotated. Therefore, in contrast to the conventional double arm sequence type substrate conveyer robot, the invention provides a substrate conveyer robot that can insert and remove the substrates to and from the containers disposed in arbitrary positions and directions within the accessible ranges of the hands 10, 10' of the robot, without increasing the number of the control axes, at a low production cost.

Further, in the foregoing construction, the control device preferably controls the angles of rotation θ and φ, φ', each so as to satisfy:

$$\{m+2L\sin(\phi)\}\sin(\theta)=h(\text{constant}),$$

$$\text{or }(m+2L\sin(\phi'))\sin(\theta)=h'\text{ (constant)},$$

where it is assumed that the center points of the substrates are offset from the pivotal center Q by constant distances h, h', and move linearly relative to the body of the robot on the straight lines H, H', in arbitrary directions within the accessible ranges of the hands 10, 10'. The distance between the first spindles 4, 4' and the second spindles 6, 6', and the distance between the second spindles 6, 6' and the third spindles 8, 8' are represented by L, and the distance before the offset between the third spindles 8, 8' and the centers of the substrates is represented by m. As the result, the combination of control of these angles of rotation θ and φ, φ' becomes very simple, with the center points of the substrates held by the hands 10, 10' offset from the pivotal center Q and moved linearly relative to the body of the robot along the straight lines H, H' in arbitrary directions within the accessible ranges of the hands 10, 10', and the substrates are inserted into and removed from the containers, while being rotated.

BRIEF DESCRIPTION OF THE DRAWINGS

Preferred embodiments of the present invention will be described in detail based on the following drawings, wherein.

DETAILED DESCRIPTION OF THE INVENTION

A first embodiment of the invention will now be described with reference to FIG. 1 through FIG. 5, and FIG. 9.

The substrate conveyer robot of the first embodiment is a so-called single arm sequence type substrate conveyer robot that possesses a single sequence arm expansion/contraction mechanism, having three arms, which is used, for example, for conveying a semiconductor wafer substrate. Generally, such a substrate is a disk and has an orientation flat (a part cut off along a straight line on the edge of the disk) that is used for positioning, etc., formed on one part of the circumference.

Figure 1:
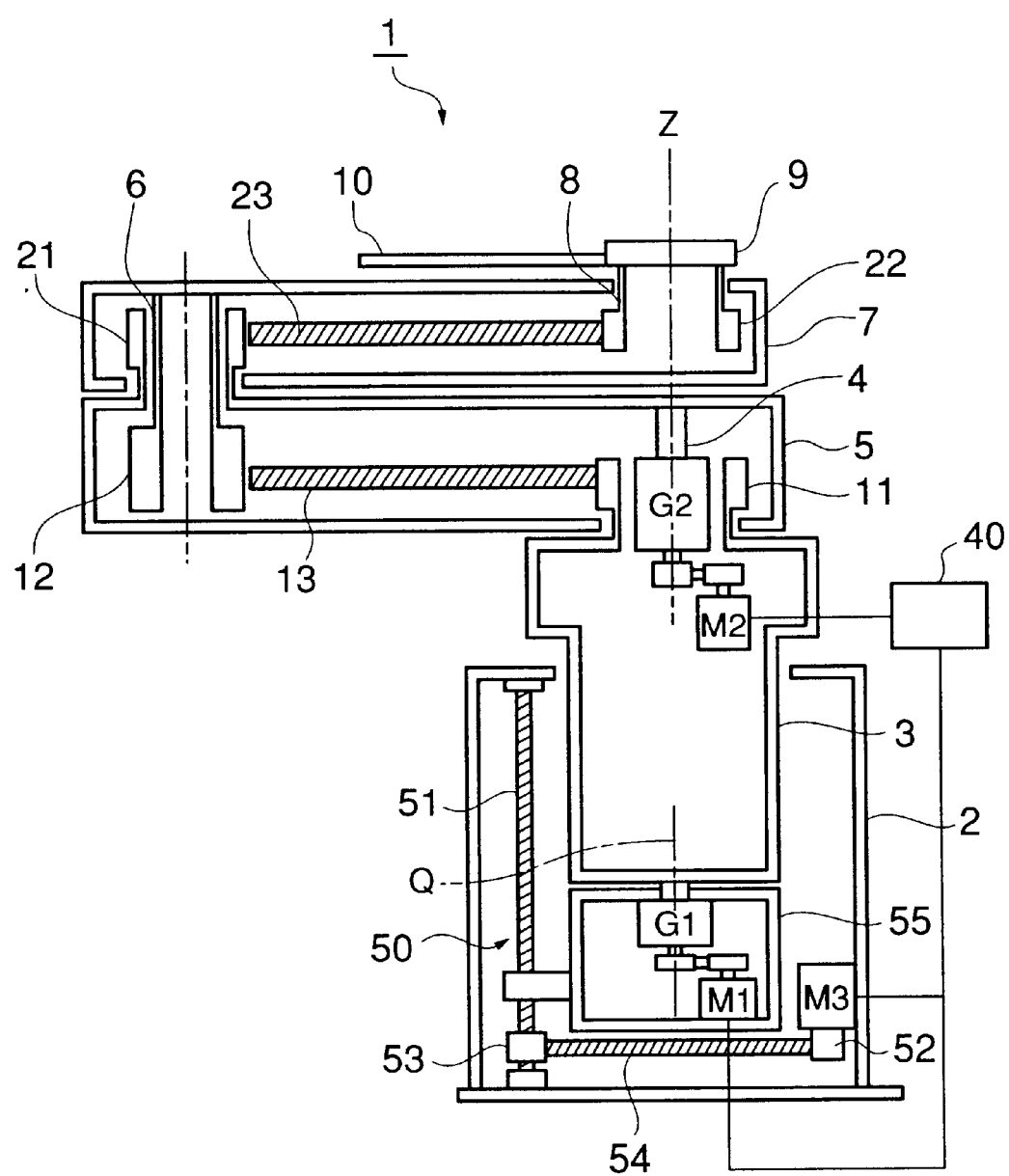
FIG. 1 is a schematic vertical sectional view of a substrate conveyer robot according to a first embodiment of the invention.
Figure 2:
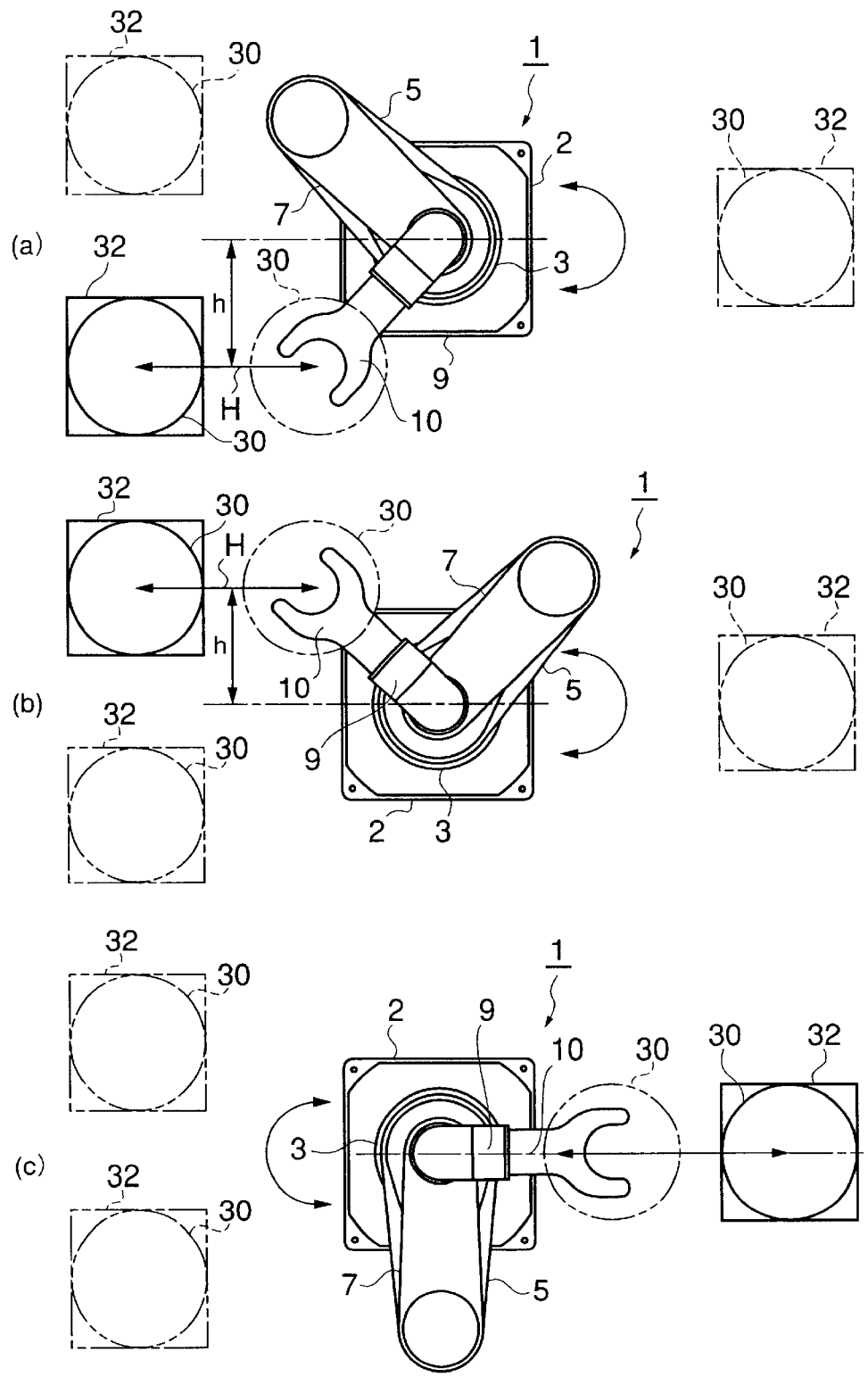
FIG. 2 illustrates the first embodiment in various operational modes.

As illustrated in FIG. 1, the substrate conveyer robot 1 of the first embodiment includes a robot body 2 with a rotatable base 3 having a pivotal center Q, which base 3 is rotatably driven by the first motor M1 via a reduction gear G1 around the pivotal center Q. The first motor M1 is housed and fixed inside an elevation base 55 installed beneath the rotation base 3.

Inside the body of the rotatable base 3, a second motor M2 is fixed on an upper part thereof. A first spindle 4, disposed on the same axis as the pivotal center Q, is rotatably driven by this second motor M2 via a reduction gear G2 and protrudes from the upper part of the body of the rotatable base 3. Therefore, the first spindle 4 will rotate with the rotation of the rotatable base 3, but its rotation driven by the second motor M2 will not be influenced by the rotation of the rotatable base 3.

The first spindle 4 is firmly attached on one end of the first arm 5 and a second spindle 6, rotatable independently of the rotation of the first arm 5, is mounted on the other end of the first arm 5. The second spindle 6 is rotated by a gear ratio of 2:1 via pulleys 11, 12 and a timing belt 13 inside the body of the first arm 5, with the rotation of the first arm 5.

The pulley 11 is formed as an upper part of the rotatable base 3 whose diameter is reduced, and this reduced diameter portion is inserted inside the first arm 5. The reduction gear G2 is received within and spaced from the reduced diameter portion. The pulley 12 is formed as a lower portion of the second spindle 6 with an enlarged diameter and is received inside the first arm 5. The second spindle 6 is formed as a hollow cylinder with an exterior shoulder. The timing belt 13 runs between the pulleys 11 and 12, and the gear ratio of these pulleys 11 and 12 is 2:1.

Therefore, if the first arm 5 is rotated through the angle $\phi$, by the rotation of the first spindle 4 that is driven by the second motor M2, the rotation through the angle $\phi$ will cause travel of the timing belt 13 on the pulley 12 the same length as the length that the timing belt 13 travels on the pulley 11, so that the rotation of the second spindle 6 will be 2 $\phi$, which is twice the angle of rotation $\phi$ of the first arm 5 (the first spindle 4), and the direction of rotation thereof will be opposite to the direction of rotation of the first arm 5.

The smaller diameter portion of the second spindle 6, which extends from the other end of the first arm 5, is firmly attached to one end of the second arm 7. On the other end of the second arm 7, a third spindle 8, rotatably independent of rotation of the second arm 7, is rotated with a gear ratio of 1:2 by way of pulleys 21, 22 and a timing belt 23, inside the second arm 7. The distance between the second spindle 6 and the third spindle 8 is identical to the distance between the first spindle 4 and the second spindle 6.

The pulley 21 is a cylindrical part integrally formed with the distal end of the first arm 5 and protrudes upward, and this cylindrical part is inserted inside the second arm 7. The smaller diameter portion of the second spindle 6 is inserted within and spaced from the pulley 21, and it extends from the other end of the first arm 5. The second spindle is rotatable independently of the rotation of the first arm 5. The pulley 22 is formed as the lower portion of the third spindle 8, i.e., as a portion of the third spindle with an enlarged diameter. The third spindle 8 is formed as a hollow cylinder with a stepped exterior surface, and the larger diameter portion (lower part) of the third spindle 8 is received inside the second arm 7 and fixed therein. The timing belt 23 runs between the pulleys 21 and 22, and the gear ratio of these pulleys 21 and 22 is 1:2.

Figure 3:
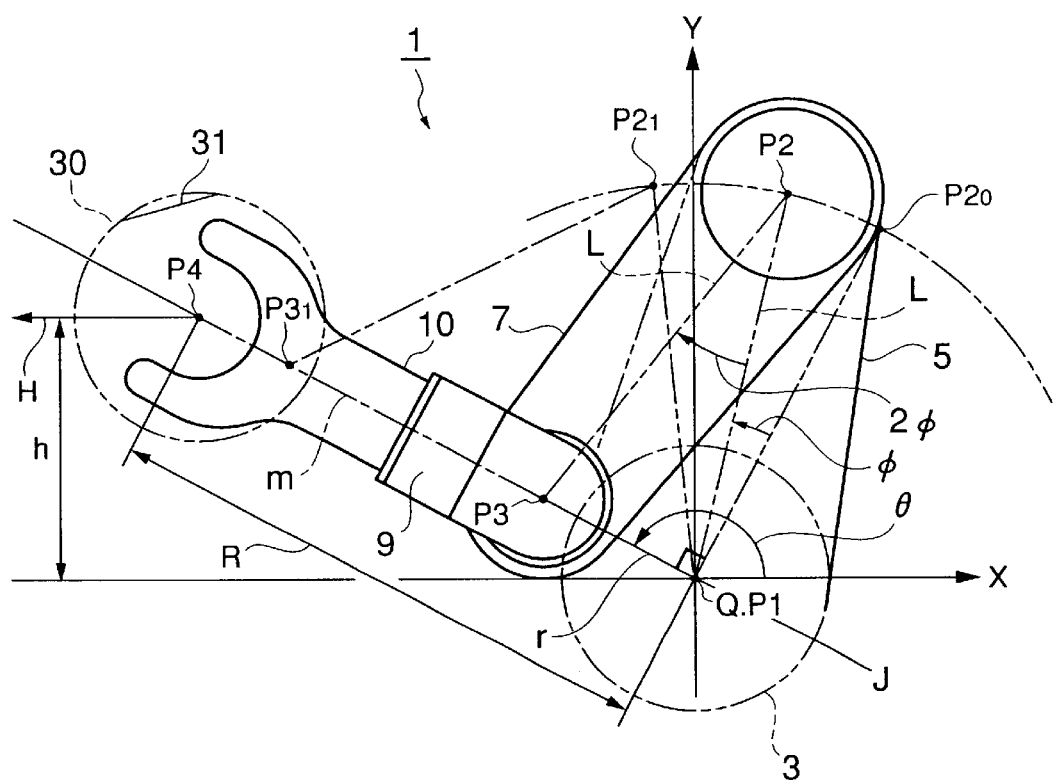
FIG. 3 explains the operation of the substrate conveyer robot of the first embodiment.

Therefore, if the second arm 7 is rotated through an of 2 $\phi$ by rotation of the second spindle 6, the rotation of the angle 2 $\phi$ will cause travel of the timing belt 23 on the pulley 22 the same length as the length that the timing belt 23 travels on the pulley 21, so that the angular rotation of the third spindle 8 caused by this travel of the timing belt 23 will be $\phi$, that is, half the rotational angle 2 $\phi$ of the second arm 7 (the second spindle 6), and the rotational direction thereof will be opposite the rotational direction of the second arm 7. This indicates that the third spindle 8 does not change the attitude of its own, even with the rotation of the first arm 5. Moreover, since the distance between the second spindle 6 and the third spindle 8 is the same as the distance between the first spindle 4 and the second spindle 6, the pivot P3 of the third spindle 8 will always be on the straight line J that passes through the pivot P1 of the first spindle 4 (and this pivot P1 coincides with the pivotal center Q). In FIG. 3, for example, when the pivot P2 of the second spindle 6 is transferred to P2$_1$, with rotation about P1, the pivot P3 of the third spindle 8 is transferred to P3$_1$, but the point P3$_1$ will still be on the straight line J. This straight line J is perpendicular ($\eta=90°$) to the straight line that connects the pivot P1 of the first spindle 4 and the initial position P2$_0$ of the pivot P2 of the second spindle 6 (refer to FIG. 1, FIG. 3, and FIG. 4(a)). Also, this initial position P2$_0$ is a point to transfer the position in accordance with the angle of rotation $\theta$ of the rotatable base 3 on a plane with the x y absolute coordinates, which will be described later.

One end of the third arm 9 is firmly attached to the third spindle 8. And, the hand 10 for holding the substrate 30 is fixed on the other end of the third arm 9. As described above, since the third spindle 8 does not change its attitude even with the rotation of the first arm 5, the third arm 9 and the hand 10 will not change their attitudes with the rotation of the first arm 5.

In the first embodiment, the pivot (center point) P4 of the substrate 30 held by the hand 10 as well as the pivot P3 of the third spindle 8 is always on the straight line J that passes through the pivot P1 of the first spindle 4 (the pivotal center Q). This straight line J is a fixed straight line on the plane of the relative x' y' coordinate system that is assumed to be on the rotatable base 3. The distance R from the pivot P4 of the substrate 30 to the pivotal center Q indicates the amount of extension of the arm expansion/contraction mechanism, and is regarded as an important measure for the operations of insertion and removal of the wafer substrate 30 to and from the cassette 32 (refer to FIG. 4). Since the amount of extension is determined by the angle of rotation of the first arm 5, it can be controlled by controlling the amount of rotation of the second motor M2 that rotatably drives the first spindle 4. The straight line J corresponds to the robot advancing/retreating axis J in the substrate conveyer robot 1 possessing the two control axes, namely the robot revolving axis θ and the robot advancing/retreating axis J.

Figure 4:
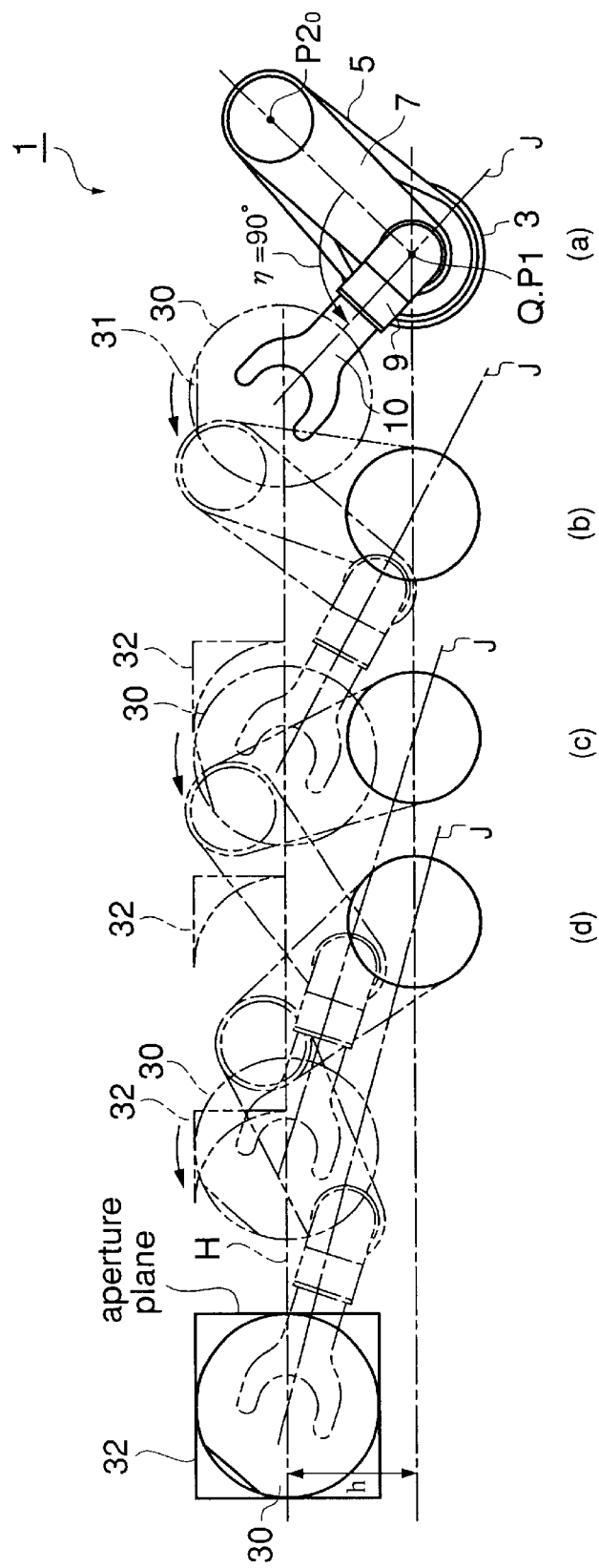
FIG. 4 illustrates various operational states of the substrate conveyer robot of the first embodiment in an overlapped manner.
Figure 5:
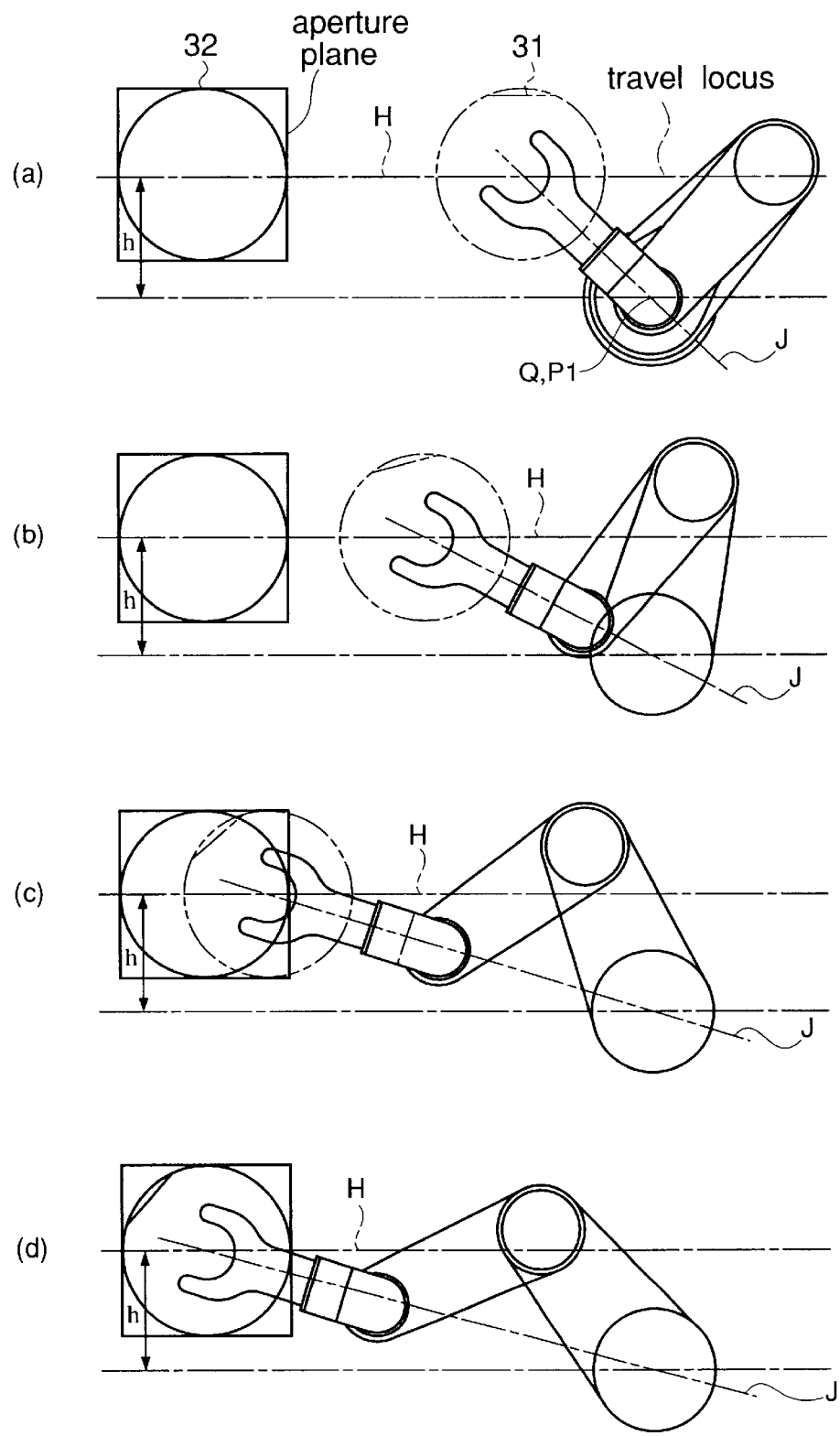
FIG. 5 illustrates separately the various operational states of the substrate conveyer robot of the first embodiment.

FIG. 3 explains each operation of the rotatable base 3 and the arm expansion/contraction mechanism having the first to third arms 5, 7, and 9, within the plane of the x y absolute coordinates established on the installation surface of the substrate conveyer robot 1, and also explains the mechanism of the ultimate movement of the center P4 of the substrate 30 along the straight line H on the plane of this coordinate system as the result of the operation. FIG. 4 illustrates the various operational states of the substrate conveyer robot 1, in an overlapped manner with the lapse of time, whereas FIG. 5 illustrates the same various operational states separately with the lapse of time.

As illustrated in FIG. 3, the straight line H does not pass through the pivot P1 (the pivotal center Q) of the first spindle 4, and deviates from the x coordinate centerline of pivot P1 by a constant distance h. The straight line J, as mentioned above, is a fixed straight line on the relative x' y' coordinate system. Therefore, on the absolute x y coordinate system, the direction of the straight line J is dependent only on the rotation angle θ of the rotation base 3. The pivotal center Q that forms a rotational center of the rotation base 3 corresponds to the robot revolving axis θ in the substrate conveyer robot 1 that possesses the two control axes, the robot revolving axis θ and the robot advancing/retreating axis J, and forms the control axis when controlling the angle of rotation θ of the rotatable base 3.

Now, on the absolute x y coordinate system, assuming that the angle of rotation of the rotatable base 3 representing the degree of rotation of the straight line J (the amount of rotation of the robot hand 10) is given as θ, the angle of rotation angle of the first arm 5 (the first spindle 4) away from the straight line P1 P2$_0$ is given as φ, the distance between the first spindle 4 and the second spindle 6 (namely, the distance between P1 and P2)=the distance between the second spindle 6 and the third spindle 8 (namely, the distance between P2 and P3) is given as L, the distance between the third spindle 8 and the center of the substrate 30 (namely, the distance between P3 and P4) is given as m, and the distance between the first spindle 4 and the third spindle 8 (namely, the distance between P1(Q) and P3) is given by r, and assuming that the center point P4 of the substrate 30 held by the hand 10 moves linearly relative to the robot body 2 on the straight line H, in an arbitrary direction and within the accessible range of hand 10, the angle ∠P1 P2 P3 that the first arm 5 and the second arm 7 form is 2φ; and therefore, the distance R between the center point P4 of the substrate 30 and the pivotal center Q (that is, the distance between P4 and P1) is represented by:

$$R = m + r = m + 2L \sin(\phi).$$

The center point P4 of the substrate 30 according to the orthogonal coordinates (x, y) is represented by:

$$P4(x, y) = P4(R\cos(\theta), R\sin(\theta))$$
$$= P4[\{m + 2L\sin(\phi)\}\cos(\theta), \{m + 2L\sin(\phi)\}\sin(\theta)].$$

Accordingly, in order for the center point P4 of the substrate 30 to always travel straight, along the straight line H which is parallel to the axis x, the angles of rotation θ and φ should be controlled by controlling the rotation of the first motor M1 and that of the second motor M2, so as to satisfy the following:

$$\{m + 2L\sin(\phi)\}\sin(\theta) = h\text{(constant)} \qquad \text{(formula 1)}.$$

The control device 40 (refer to FIG. 1) controls each of the rotation amount of the first motor M1 and that of the second motor M2, so that the angles of rotation θ and φ always satisfy the above formula 1.

Further, as illustrated in FIG. 4 (a) through FIG. 4 (d), and FIG. 5 (a) through FIG. 5 (d), the center point P4 of the substrate 30 moves on the straight line H, while the whole substrate 30 is being rotated around the center point P4. The substrate 30 can be conveniently be inserted into the cassette 32 without colliding against or making contact with the inner wall of the cassette 32 during the insertion, since the outline of the substrate 30 is circular except for the orientation flat. The same can be said for taking out the substrate 30 from the cassette 32.

The cassette 32 may be positioned in an arbitrary position and direction, as long as it is within the accessible range of the robot hand 10. Moreover, since the straight line H used for the insertion of the substrate 30 into the cassette 32 (the travel locus of the substrate 30 during the insertion) does not pass through the pivotal center as illustrated in FIG. 2(a) through FIG. 2(c), the wafer substrate 30 can be inserted into and taken out of the cassette 32 in various positions. Besides, with regard to the robot 1 with the configuration illustrated in FIG. 1, since the pivotal center Q, around which all the arms of the robot (the whole arm expansion/contraction mechanism) revolve, and the pivot P1 of the first spindle 4 are made to coincide with each other, the first motor M1 and the second motor M2 can be simply controlled so that the rotation angles θ and φ satisfy the very simple formula 1, thus making the control method very simple.

The substrate conveyer robot 1 according to the first embodiment further possesses an ascent/descent mechanism 50, which lifts and lowers the rotatable base 3 and the whole arm expansion/contraction mechamsm. The ascent/descent mechanism 50 includes a third motor M3 being a drive for the mechanism, pulleys 52, 53, and a timing belt 54. The pulleys 52, 53, and the timing belt 54 transmit the output of the third motor M3 to a ball screw mechanism 51. By the rotation of the third motor M3, the ascent/descent mechanism 50 carries up and down an elevation base 55 that contains the first motor M1, and thereby lifts and lowers the rotatable base 3 that is on the upper part of the elevation base 55, and the whole arm expansion/contraction mechanism vertically along the Z-axis. Therefore, the substrate conveyer robot 1 possesses the robot ascending/descending axis Z as a third control axis, in addition to the two previously described control axes, i.e., the robot revolving axis θ and the robot advancing/retreating axis J. As the result, the substrate conveyer robot 1 is able to handle plural cassettes 32 positioned at different height levels.

Configured as described above, the first embodiment offers the following advantages.

In the single arm sequence type substrate conveyer robot 1 having the arm expansion/contraction mechanism that comprises the first through the third arms, 5, 7 and 9, the angle of rotation θ of the rotatable base 3 inside the robot body 2 and the angle of rotation φ of the first arm 5 are controlled by the control device 40 in such a manner that the center point P4 of the substrate 30 held by the hand 10, moves linearly on the straight line H in an arbitrary direction within the accessible range of the robot hand 10, and the substrate 30, while being rotated, can be inserted into and removed from the cassette 32. Therefore, in contrast to the conventional single arm sequence type substrate conveyer robot, this embodiment provides an inexpensive substrate conveyer robot that can insert and remove the substrate 30 to and from a cassette 32 disposed in an arbitrary position and direction within the accessible range of the robot hand 10, without an increase in the number of the control axes. Moreover, since the control of the angles of rotation θ and φ by the control device 40 requires only that these angles of rotation θ and φ always satisfy the foregoing formula 1, the control of the combination of these angles of rotation θ and φ is extremely simple.

Next, a second embodiment of the invention will be explained with reference to FIG. 6 through FIG. 8, and FIG. 10.

Figure 6:
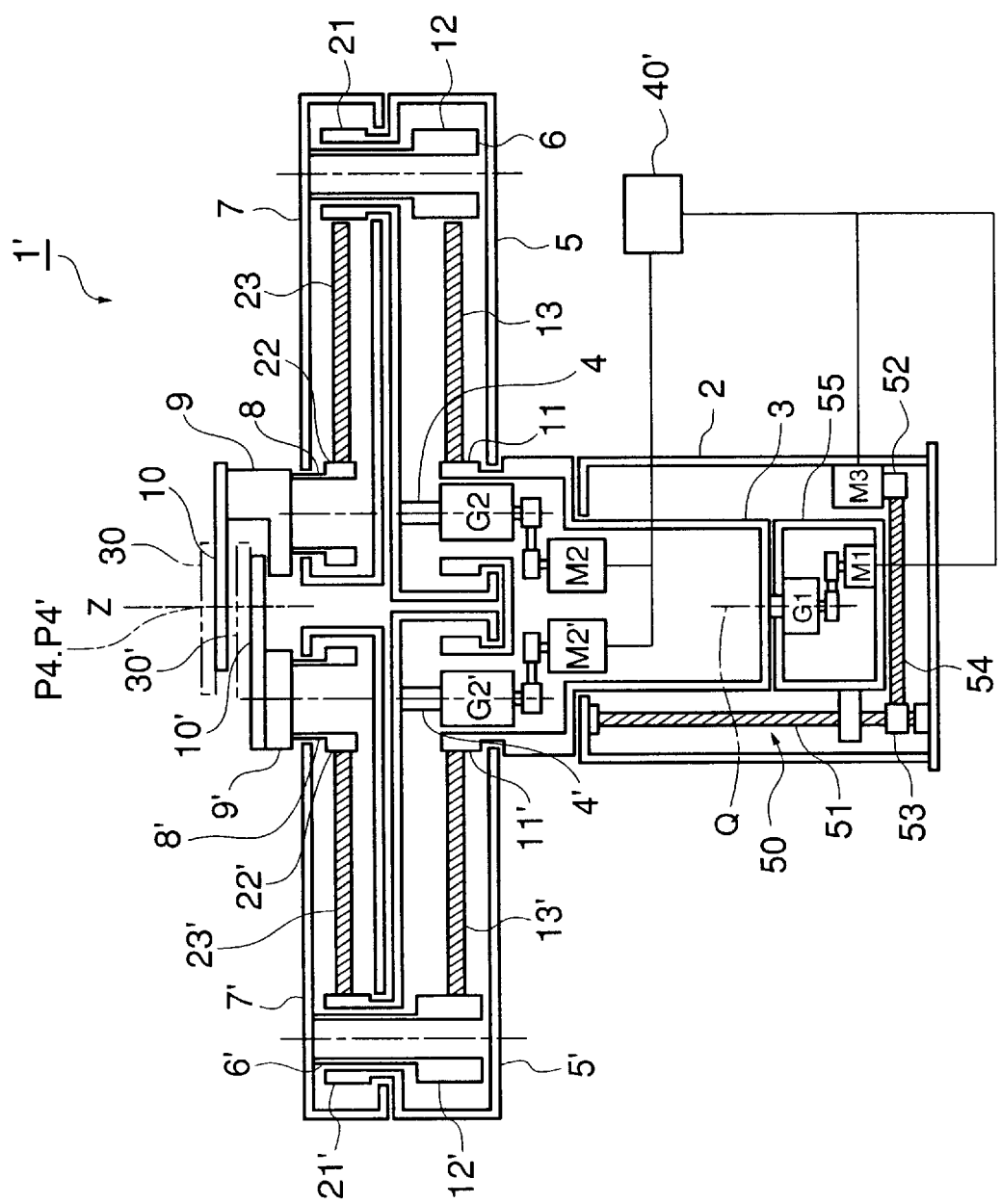
FIG. 6 is a schematic vertical sectional view of a substrate conveyer robot according to a second embodiment of the invention.
Figure 10:
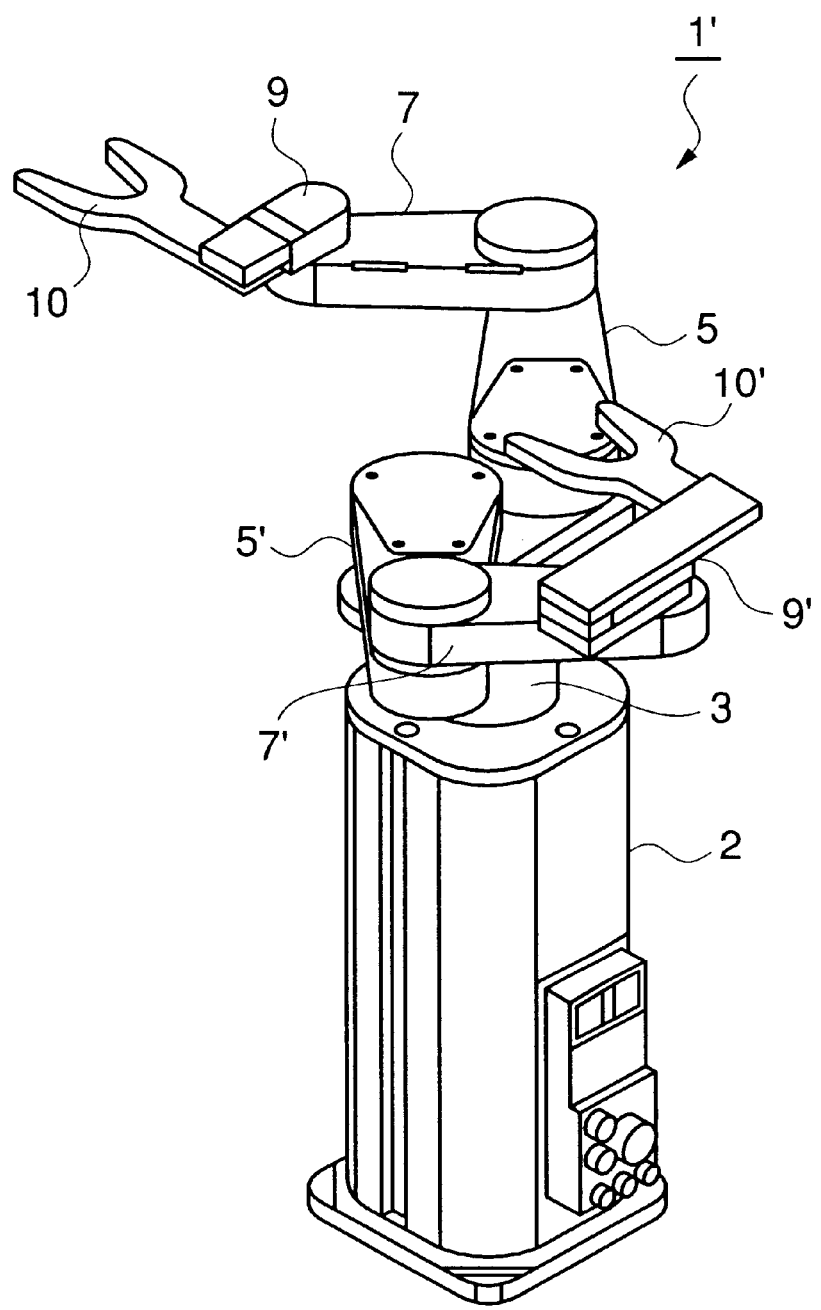
FIG. 10 is a perspective view of the substrate conveyer robot of the second embodiment shown in FIG. 6.
Figure 11:
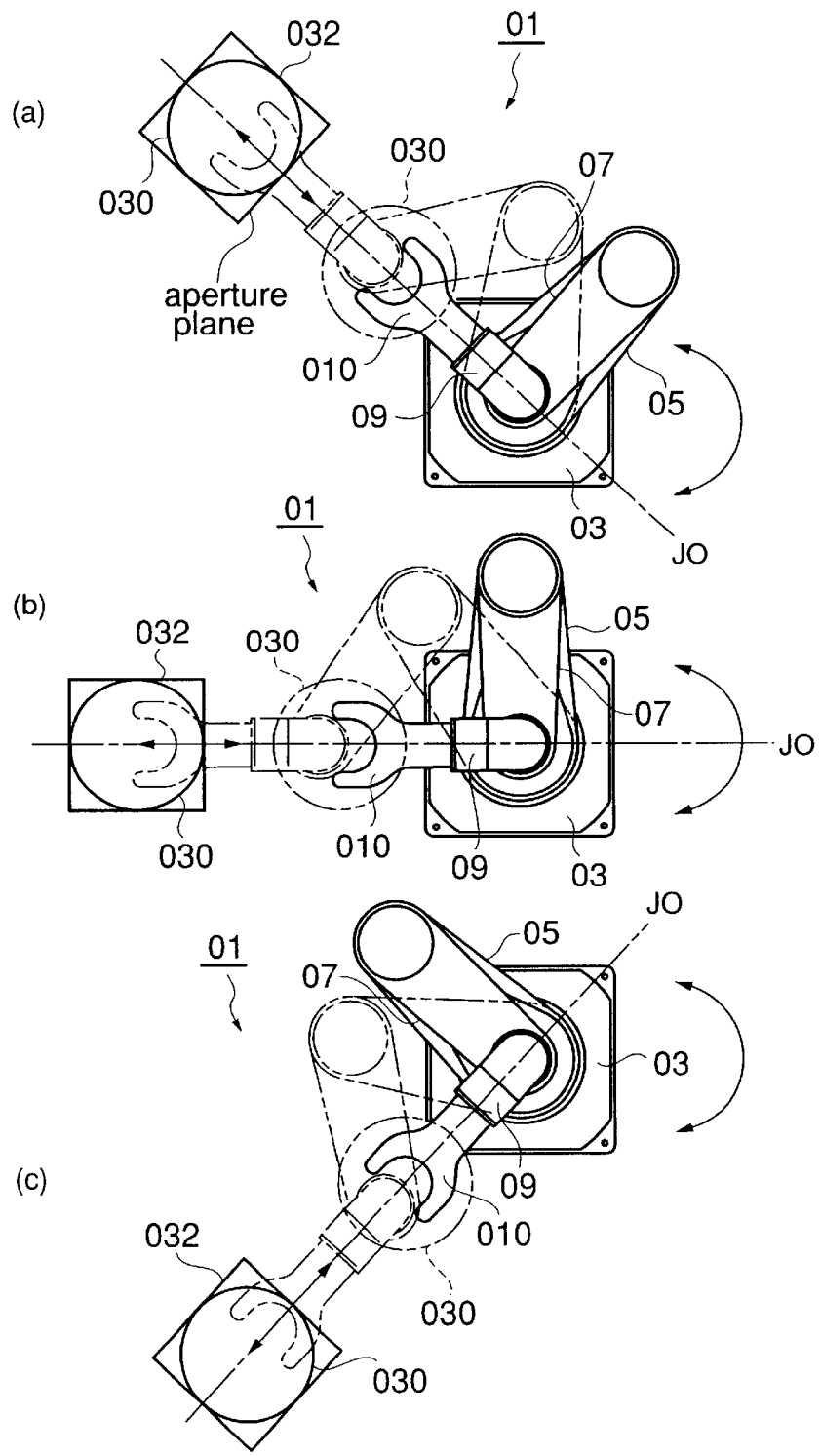
FIG. 11 illustrates an example of a conventional substrate conveyer robot.

The substrate conveyer robot according to the second embodiment, as illustrated in FIG. 6 and FIG. 10, is configured as a so-called double arm sequence type substrate conveyer robot 1, that includes one pair (two sequences) of arm expansion/contraction mechanisms in a bilateral symmetry, each composed of three arms (first through third arms).

Figure 7:
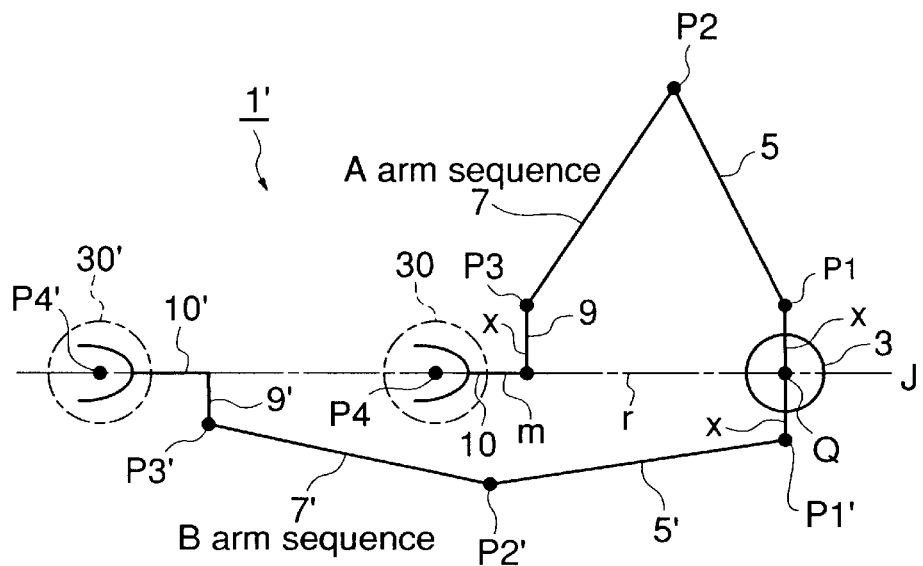
FIG. 7 is a skeletal view of an initial state of the substrate conveyer robot of the second embodiment.

In the arm expansion/contraction mechanisms of the arm sequences A and B providing the double arm sequence, as illustrated in FIG. 6 and FIG. 7, the pivots P1 and P1' of the first spindles 4 and 4' are placed at symmetrical positions relative to the pivotal center Q of the rotatable base 3 to be offset therefrom by an equal distance x, and the second motors M2 and M2' are provided as the driving sources for the first spindles 4 and 4', respectively. Also, the center points P4 and P4' of the substrates 30 and 30', respectively held by the hands 10 and 10', are offset by the equal distance x from the pivots P3 and P3' of the third spindles 8 and 8', in a direction opposite to the direction in which the pivots P1 and P1' of the first spindles 4 and 4' are symmetrically offset from the pivotal center Q.

Figure 8:
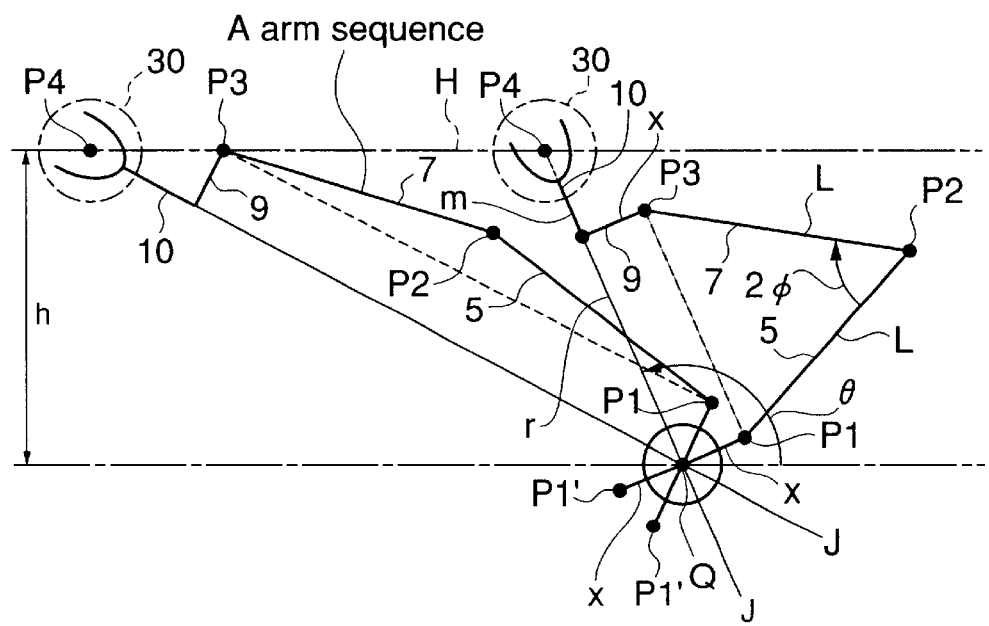
FIG. 8 is a skeletal view explaining the operational mechanism of the substrate conveyer robot of the second embodiment.
Figure 9:
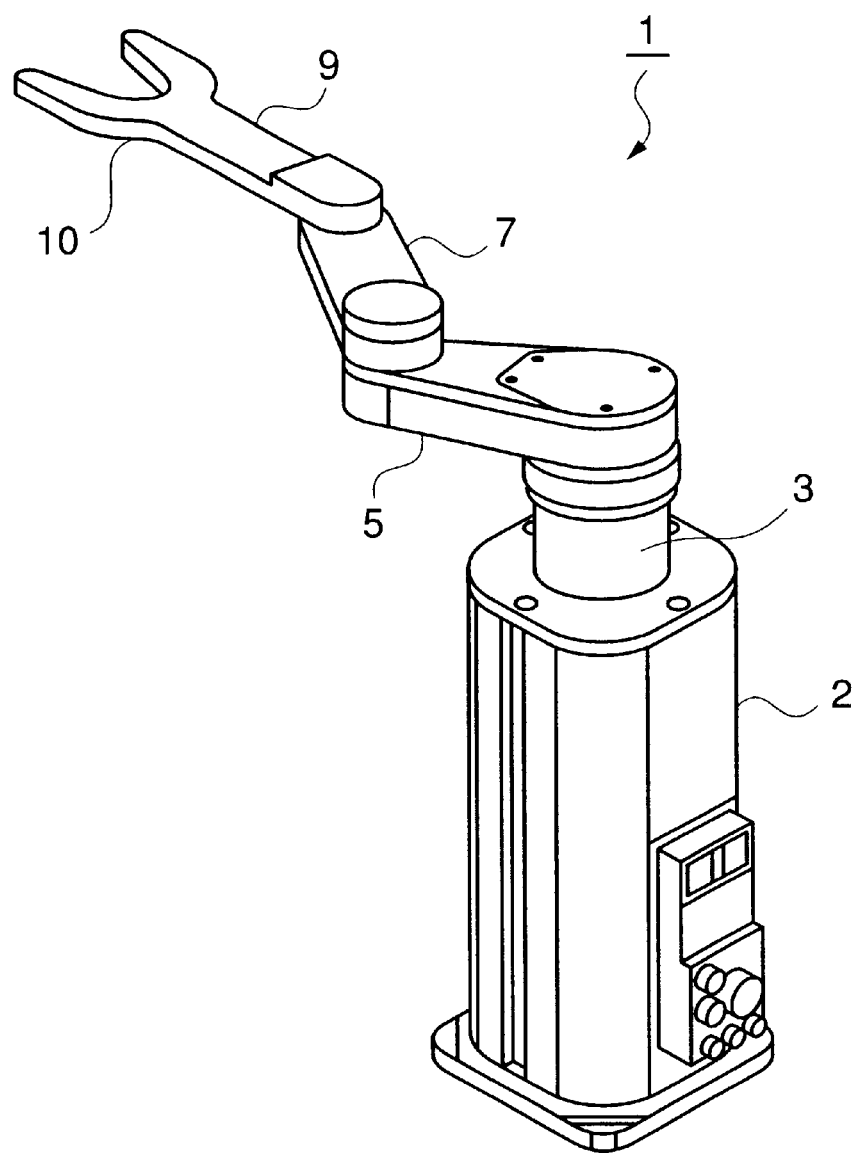
FIG. 9 is a perspective view of the substrate conveyer robot of the first embodiment shown in FIG. 1.

There are several methods of achieving the configuration wherein first ends of the third arms 9 and 9' are attached to the third spindle 8 and 8', respectively, and the hands 10 and 10' for holding the substrates 30 and 30' are fastened on the other ends of the third arms 9 and 9', and as described above, the center points P4 and P4' of the substrates 30 and 30' are positioned offset inside by the equal distance x relative to the pivots P3 and P3' of the third spindles 8 and 8'. In short, the amount of offset of the centers P4 and P4' of the substrates 30 and 30' relative to the pivots P3 and P3' of the third spindles 8 and 8' need only to be set to x, in a direction opposite the direction in which the centers P1 and P1' of the first spindles 4 and 4' are offset from the pivotal center Q). As illustrated in FIG. 7 and FIG. 8, this second embodiment allows the hands 10 and 10' to be moved perpendicularly to the third arms 9 and 9', respectively, and along the straight line J. Here, the straight line J is a line connecting each of the centers P4 and P4' of the substrates 30 and 30' with the pivotal center Q, which corresponds to the robot advancing/retreating axis as the control axis.

The arm expansion/contraction mechanism of each of the arm sequences A and B in the double arm sequence type substrate conveyer robot 1' of the second embodiment differs from that of the single arm sequence type substrate conveyer robot 1 of the first embodiment in terms of the points mentioned above. However, the configuration and the operation of the second embodiment do not basically differ from those of the first embodiment. The movements of the center points P4 and P4' of the substrates 30 and 30' on the straight line J are also the same as those of the first embodiment. The rotatable base 3 is shared by the arm expansion/contraction mechanisms of the arm sequences A and B which serves to rotate the whole of both arm expansion/contraction mechanisms, and the angle of rotation θ around the pivotal center Q (the robot revolving axis θ) of the rotatable base 3 becomes the angle of rotation of each of the arm expansion/contraction mechanisms.

As mentioned above, the movement of the arm expansion/contraction mechanism of each of the arm sequences A and B in the double arm sequence type substrate conveyer robot 1' of the second embodiment is the same as that of the arm expansion/contraction mechanism in the single arm sequence type substrate conveyer robot 1 of the first embodiment. The arm expansion/contraction mechanisms of the arm sequences A and B share the pivotal center Q and use it alternately, thereby each being able to convey the substrates 30 and 30' toward the cassette 32, while the arm expansion/contraction mechanisms each rotate the substrates 30 and 30' independently, alternately and move them on the straight lines H and H' which do not pass through the pivotal center Q, and which extend toward the aperture plane of the cassette 32. Naturally, this robot is also able to perform a conveyance movement such that the center points P4 and P4' of the substrates 30 and 30' move on the straight line J passing through the pivotal center Q, in the same manner as the conventional substrate conveyer robot.

With regard to the arm expansion/contraction mechanisms of the arm sequences A and B in the double arm sequence type substrate conveyer robot 1', the setting of the offset from the pivotal center Q of the pivots P1 and P1' of the first spindles 4 and 4', to the amount described above, satisfies the following formulas, in the same manner as does the single arm sequence type substrate conveyer robot 1:

$$\{m+2L\sin(\phi)\}\sin(\theta)=h\text{(constant)} \qquad \text{(formula 1)}$$

$$\text{or, } \{m+2L\sin(\phi')\}\sin(\theta)=h'\text{ (constant)} \qquad \text{(formula 1')},$$

where it is assumed that the distance before the offset between the third spindles 8 and 8' and the centers of the substrates 30 and 30' is represented by m.

The control device 40' needs only control the first motor M1 and the second motor M2, and the first motor M1' and the second motor M2', by turns, so that the angle of rotation θ of the rotatable base 3 and the angles of rotation φ and φ' of the first arms 5, 5' always satisfy the above formula 1 and formula 1'. Thus, the arm expansion/contraction mechanism of the arm sequence A can remove the unprocessed substrate 30 from the cassette 32 that is positioned in an arbitrary position and direction within the accessible range of the hands 10 and 10', and the arm expansion/contraction mechanism of the arm sequence B can return the processed substrate 30' to the cassette 32 in turn. Of course, two cassettes can be used, one of which is used for containing unprocessed substrates 30, and another of which is used for containing processed substrates 30.

Each of the members constituting the arm expansion/contraction mechanism of the arm sequence B and the other members is designated by the mark (') on the symbol attached to each of the corresponding members constituting the arm expansion/contraction mechanism of the arm sequence A and the other corresponding members, and further detailed explanation of the double arm sequence type substrate conveyer robot 1' of the second embodiment will be omitted.

Being configured as described above, the second embodiment provides the following effects.

In the double arm sequence type substrate conveyer robot 1' possessing a pair of symmetrically arranged arm expansion/contraction mechanisms composed of the first through the third arms 5, 5', 7, 7', and 9, 9', the angle of rotation θ of the rotatable base 3 inside the robot body 2 and the angles of rotation φ and φ' of the first arms 5, 5' are controlled by the control device 40' in such a manner that the center points P4 and P4' of the substrates 30 and 30' held by the hands 10 and 10', deviating from the pivotal center Q by the constant distances h and h', each move linearly on the straight lines H and H' in arbitrary directions, within the accessible ranges of the hands 10 and 10', and the substrates 30 and 30', while being rotated, can be inserted into and removed from the cassette(s) 32. Therefore, compared with the conventional double arm sequence type substrate conveyer robot, the second embodiment provides an inexpensive substrate conveyer robot 1' that can insert and remove the substrates 30 and 30' to and from the cassette(s) 32 disposed in arbitrary positions and directions, within the accessible ranges of the robot hands 10 and 10', without increasing the number of the control axes.

Moreover, since the control of the angles of rotation θ and φ, φ' by the control device 40' requires only that these angles of rotation θ and φ, φ' always satisfy the foregoing formulas 1 and 1', the arm expansion/contraction mechanism of each of the arm sequences a and b is able to employ a common control method, thus making the combination control of these rotation angles θ and φ, φ' extremely simple.

What is claimed is:

1. A substrate conveyer robot comprising:

a rotatable base rotatably driven by a first motor inside a body portion of the robot and defining a pivotal center for the robot;

plural first spindles mounted for rotation independent of the rotation of the rotatable base, each first spindle offset by the same distance from the pivotal center;

plural second motors for rotatably driving respective first spindles;

a first arm attached at one end to each first spindle;

a second spindle rotatably mounted on a second end of each of the first arms, and plural first rotation transfer means for transferring rotation of the first arm to each of the second spindles, each of said first transfer means including pulleys and a timing belt, mounted inside the first arm and providing a 2:1 gear ratio;

a second arm attached at one end to each second spindle;

a third spindle rotatable mounted on a second end of each second arm, and plural second rotation transfer means for transferring rotation of the second arm to the third spindle, each of said second rotation transfer means including pulleys and a timing belt mounted inside the second arm and providing a 1:2 gear ratio wherein a distance between the first spindles and the second spindles is equal to a distance between the second spindles and the third spindles;

a third arm attached at one end to each third spindle;

a hand for holding a substrate attached to a second end of each third arm; and control means for controlling angles of rotation θ and φ, φ' in such a manner that center points of substrates held by the hands move linearly on a straight line parallel to and spaced from a line passing through the pivotal center, in an arbitrary direction within an accessible range of the hand, wherein θ is the angle of rotation of the rotatable base about the pivotable center and φ and φ' are the angles of rotation of the respective first arms about the first spindles, whereby a substrate may be inserted into and removed from a container by each of said hands.

2. A substrate conveyer robot as claimed in claim 1, wherein said control means controls each of the angles of rotation θ and φ, φ' so as to satisfy the following equation:

$$\{m+2L\sin(\varphi)\}\sin(\theta)=h(\text{constant})$$

and $\{m+2L\sin(\varphi')\}\sin(\theta)=h'(\text{constant})$ wherein:

h is a constant distance between the straight line along which the center point of a substrate moves and a line passing through the pivotal center;

L is the distance between the second spindle and the third spindle; and m is the distance between the third spindle and the center of the substrate.

* * * * *

UNITED STATES PATENT AND TRADEMARK OFFICE
CERTIFICATE OF CORRECTION

PATENT NO. : 6,764,271 B2  
APPLICATION NO. : 09/986952  
DATED : July 20, 2004  
INVENTOR(S) : Momoki Page 1 of 1

It is certified that error appears in the above-identified patent and that said Letters Patent is hereby corrected as shown below:

Col. 11, line 33 "a and b" should read "A and B".

Col. 12, line 6, "rotatable" should read --rotatably--.

Signed and Sealed this

Eleventh Day of July, 2006

JON W. DUDAS  
*Director of the United States Patent and Trademark Office*